(12) United States Patent
Loiko et al.

(10) Patent No.: US 7,960,267 B2
(45) Date of Patent: Jun. 14, 2011

(54) METHOD FOR MAKING A STRESSED NON-VOLATILE MEMORY DEVICE

(75) Inventors: Konstantin V. Loiko, Austin, TX (US); Brian A. Winstead, Austin, TX (US); Taras A. Kirichenko, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 115 days.

(21) Appl. No.: 12/414,778

(22) Filed: Mar. 31, 2009

(65) Prior Publication Data

US 2010/0248466 A1   Sep. 30, 2010

(51) Int. Cl.
*H01L 21/3205* (2006.01)
*H01L 21/4763* (2006.01)

(52) U.S. Cl. . 438/591; 438/593; 438/594; 257/E21.092; 257/E21.209

(58) Field of Classification Search .................. 438/593, 438/283, 287, 591, 594, 296; 257/E21.092, 257/E21.209
See application file for complete search history.

(56) References Cited

U.S. PATENT DOCUMENTS

| | | | |
|---|---|---|---|
| 5,408,115 A * | 4/1995 | Chang | 257/E29.309 |
| 6,875,660 B2 | 4/2005 | Hung et al. | |
| 7,235,441 B2 | 6/2007 | Yasui et al. | |
| 7,436,019 B2 | 10/2008 | Lutze et al. | |
| 7,446,370 B2 | 11/2008 | Chang et al. | |
| 7,494,860 B2 | 2/2009 | Mokhlesi | |
| 7,557,402 B2 | 7/2009 | Shyu et al. | |
| 7,700,439 B2 * | 4/2010 | Prinz et al. | 438/267 |
| 2003/0034517 A1 * | 2/2003 | Chen | 438/201 |
| 2005/0104115 A1 | 5/2005 | Kianian | |
| 2007/0132054 A1 | 6/2007 | Arghavani et al. | |
| 2008/0042183 A1 | 2/2008 | Mokhlesi | |
| 2008/0142871 A1 * | 6/2008 | Anezaki | 257/321 |
| 2008/0188052 A1 * | 8/2008 | Winstead et al. | 438/299 |
| 2008/0261385 A1 | 10/2008 | Jawarani et al. | |
| 2009/0072294 A1 * | 3/2009 | Yang et al. | 438/264 |

OTHER PUBLICATIONS

Arghavani et al; "Strain Engineering to Improve Data Retention Time in Non-Volatile memory"; IEEE Transactions on Electron Devices, vol. 54, No. 2, Feb. 2007.
Ortolland et al; "Stress Memorization Technique (SMT) Optimization for 45nm CMOS"; 2006 Symposium on VLSI Technology, 2006. Digest of Technical Papers. pp. 78-79.
Ferri et al; "Influence of film thickness on the crystallization of Ni-doped amorphous silicon samples"; Journal of Applied Physics, vol. 104, 2008.
Zanatta et al; "Crystallization, stress, and stress-relieve due to nickel in amorphous silicon thin films"; Journal of Applied Physics, vol. 102, 2007.
USPTO Office Action in U.S. Appl. No. 12/414,763, Mailed Apr. 7, 2010.

* cited by examiner

*Primary Examiner* — Walter L Lindsay, Jr.
(74) *Attorney, Agent, or Firm* — James L. Clingan, Jr.; Daniel D. Hill

(57) ABSTRACT

A method of making a semiconductor device on a semiconductor layer includes: forming a gate dielectric over the semiconductor layer; forming a layer of gate material over the gate dielectric; etching the layer of gate material to form a select gate; forming a storage layer that extends over the select gate and over a portion of the semiconductor layer; depositing an amorphous silicon layer over the storage layer; etching the amorphous silicon layer to form a control gate; and annealing the semiconductor device to crystallize the amorphous silicon layer.

19 Claims, 5 Drawing Sheets

METHOD FOR MAKING A STRESSED NON-VOLATILE MEMORY DEVICE

RELATED APPLICATIONS

This invention is related to application Ser. No. 12/414,763; titled "Stressed Semiconductor Device and Method for Making" by Konstantin Loiko, Cheong Min Hong, Sung-Taeg Kang, Taras Kirichenko, and Brian Winstead; assigned to the assignee hereof; and filed on even date herewith.

BACKGROUND

1. Field

This disclosure relates generally to memories, and more specifically, to a method for making a stressed non-volatile memory device.

2. Related Art

Semiconductor non-volatile memories (NVMs), and particularly flash electrically erasable, programmable read-only memories (EEPROMs), are widely used in a range of electronic equipment from computers, to telecommunications hardware, to consumer appliances. The flash EEPROM is encountered in numerous configurations. In particular, a floating-gate NVM cell is characterized by a stacked gate construction in which a floating gate, typically formed from polysilicon, is separated from the substrate by a first (lower) oxide layer and is separated from a polysilicon control gate by a second (upper) oxide layer. No direct electrical connection is made to the floating gate (hence, "floating").

In another configuration, a charge storage layer comprising nanocrystals as the charge storage mechanism is used in place of the floating gate. The nanocrystals function as isolated charge storage elements.

As devices continue to become smaller with advances in semiconductor device technology, the performance of the individual memory cells has become more important. The read function in particular suffers with reduced device performance.

In many prior art non-volatile memory (NVM) devices, the charge storage layer is separated from the channel region by a relatively thin tunnel dielectric layer. There can be a problem of charge leakage from the charge storage layer to the underlying channel. Such charge leakage can lead to degradation of the memory state stored within the device and is therefore undesirable. In order to avoid such charge leakage, the thickness of the tunnel dielectric is often increased. However, a thicker tunnel dielectric requires higher programming and erasing voltages for storing and removing charge from the charge storage layer as the charge carriers must pass through the thicker tunnel dielectric. In many cases, higher programming voltages increase power consumption and may require the implementation of charge pumps in order to increase the supply voltage to meet programming voltage requirements. Such charge pumps consume a significant amount of die area for the integrated circuit and therefore reduce the memory array area efficiency and increase overall costs.

Therefore, what is needed is a NVM cell with improved performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a split-gate NVM cell has enhanced performance by having a stressed charge storage layer as a result of a change of the control gate changing from amorphous silicon to polysilicon while a stressor layer is over both the control gate and the select gate before source/drain formation. The stress changes the energy barrier height between the bottom insulator and the nanocrystals of the charge storage layer gate. The stress may also increase the effective mass in the nanocrystals of the charge storage layer. The higher energy barrier and increased effective mass improve data retention of the nanocrystals by reducing a leakage current from the charge storage layer to the channel region. The conversion from amorphous to polysilicon is achieved with an anneal that has the effect of applying tensile stress in the plane of the charge storage layer. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
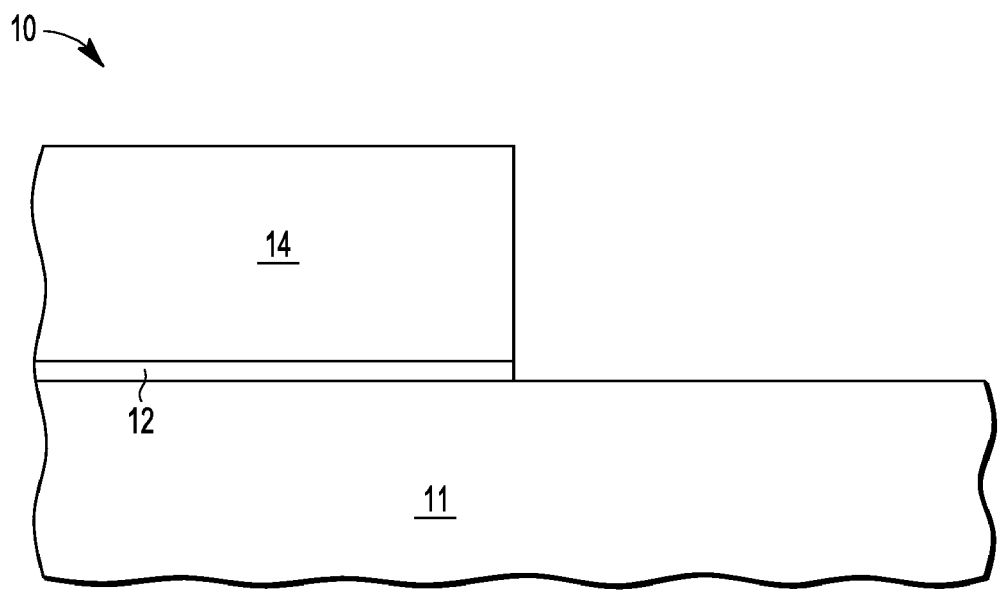
FIG. 1 is a cross section of a semiconductor device at a stage in processing according to an embodiment.

Shown in FIG. 1 illustrates, in cross-section, a semiconductor device 10 that is a partially completed NVM device. Semiconductor device 10 as shown In FIG. 1 comprises a substrate 11, gate dielectric 12 on substrate 11, and a select gate portion 14 on gate dielectric 12. Gate dielectric 12 may be grown oxide or a high k dielectric or some other material suitable for a gate dielectric. Gate dielectric may be a conventional, thermally formed silicon dioxide or silicon oxynitride with a thickness of less than 10 nanometers. In another embodiment, gate dielectric 12 may comprise an alternative gate material such as a first or second transition metal oxide or rare earth oxide material. Such alternative gate dielectric materials are suitable for their high dielectric constant (K), which enables the use of a thicker gate dielectric layer without adversely affecting the electrical and capacitive characteristics of the film. One preferred high K gate dielectric is hafnium oxide ($HfO_2$). For these alternative gate dielectrics, suitable transition metal oxide composites selected from oxides of zirconium, hafnium, aluminum, lanthanum, strontium, tantalum, titanium, silicon and the combinations thereof may be used. Transition metal silicates and aluminates may also be used for the gate dielectric, such as hafnium silicate ($Hf_xSi_yO_z$) hafnium aluminate ($Hf_xAl_yO_z$). A polysilicon layer is formed over gate dielectric 12 etched using conventional deposition and etch processes to form select gate portion 14 so select gate portion 14 may also be called polysilicon layer 14 in this example. This leaves a portion of substrate 11 exposed.

Figure 2:
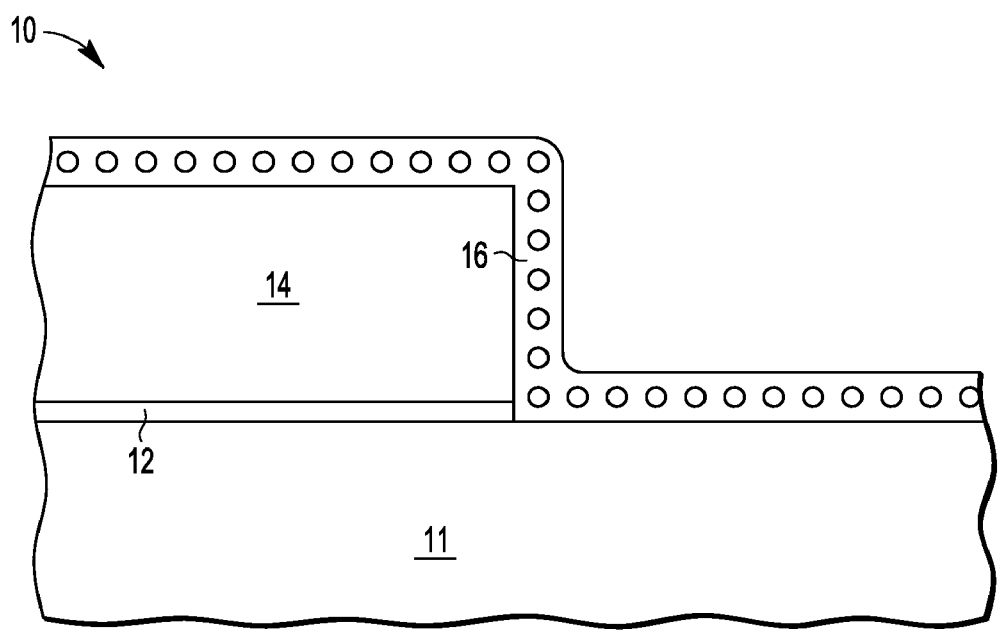
FIG. 2 is a cross section of the semiconductor device of FIG. 1 at a subsequent stage in processing.

Shown in FIG. 2 is semiconductor device 10 after a storage layer 16 has been deposited over select gate portion 14 and over the exposed portion of substrate 11. Storage layer 16 as shown is a layer of nanocrystals but another type of storage layer useful in storing charge may be used instead. Nanocrystals are typically formed of silicon, but the discrete storage elements may also be formed of clusters of material consisting of, for example, of germanium, silicon carbide, any number of metals, or in any combination. Alternately, the charge storage material may consist of nitride, although any number of dielectrics containing traps may be used, such as aluminum oxide, zirconium oxide, hafnium oxide, tantalum oxide, lanthanum oxide, hafnium silicate, or hafnium aluminate. In another embodiment, storage layer 16 may be formed from a different material, such as for example, a floating gate formed from polysilicon.

Figure 3:
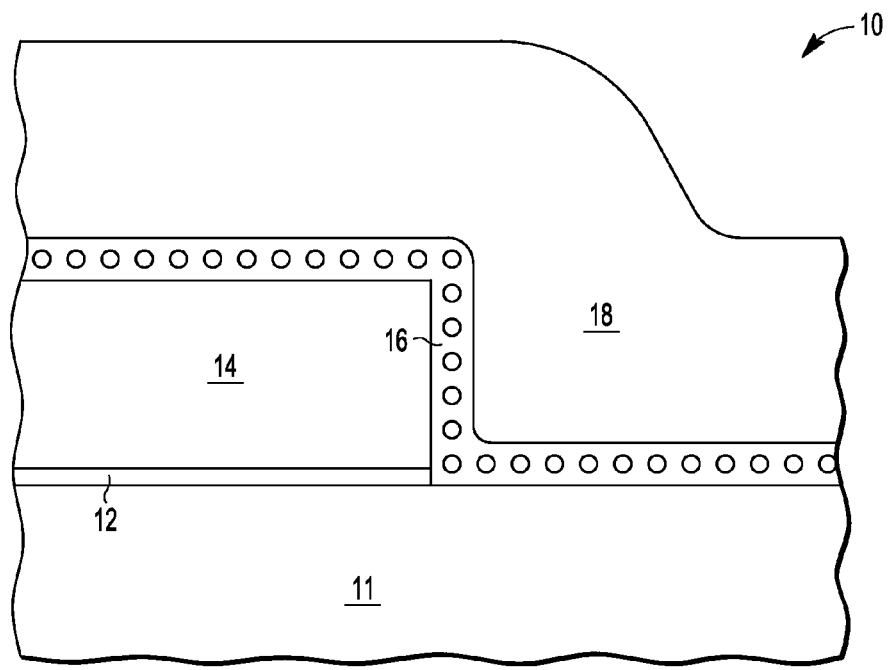
FIG. 3 is a cross section of the semiconductor device of FIG. 2 at a subsequent stage in processing.

Shown in FIG. 3 is semiconductor device 10 after depositing an amorphous silicon layer 18, which may be doped or undoped, over storage layer 16. Amorphous silicon layer 18 is preferably deposited by sputtering although it may be possible to deposit an effective amorphous silicon layer by a chemical vapor deposition (CVD) such as low-pressure or plasma enhanced CVD. Impurities may be included in amorphous silicon layer 18, such as nickel, gold, platinum, aluminum, copper, palladium, germanium, arsenic, and potentially other materials that combine with silicon to form a gate material that, when it converts from amorphous to polycrystalline, will be useful in generating a tensile stress on the charge storage layer. In the case of sputtering, one or more of these impurities may be included in a silicon target. Sputtering is particularly advantageous because of a relatively high density of deposited amorphous silicon which tends to expand when it is converted to polycrystalline form.

Figure 4:
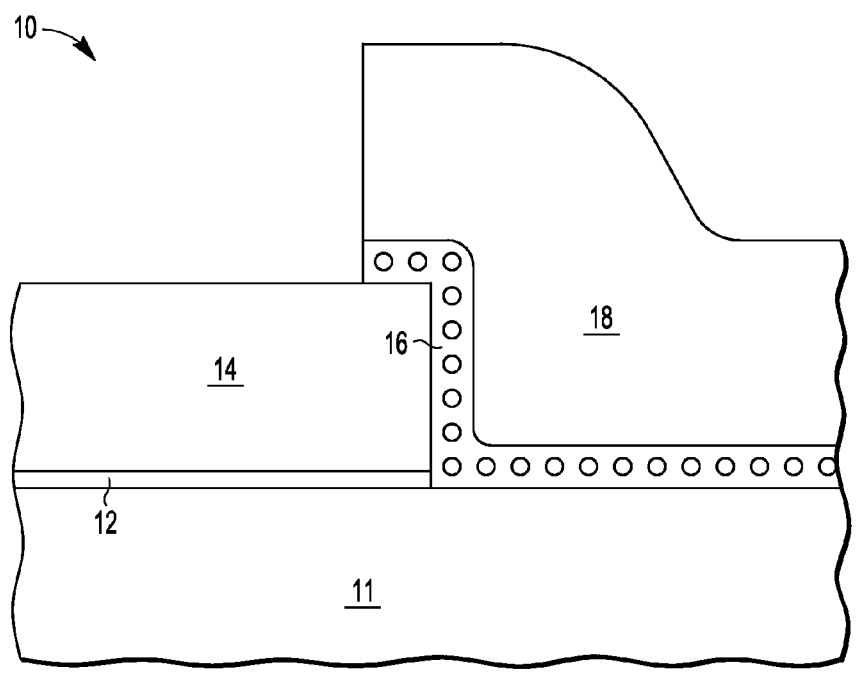
FIG. 4 is a cross section of the semiconductor device of FIG. 3 at a subsequent stage in processing.

Shown in FIG. 4 is semiconductor device 10 after etching amorphous silicon layer 18 and storage layer 16 from over polysilicon layer 14. The etch is patterned so that a small portion of amorphous silicon layer 18 remains over polysilicon layer near a sidewall of polysilicon layer 14 where it is adjacent to a sidewall of amorphous silicon layer 18. Charge storage layer 16 is between polysilicon layer 14 and amorphous silicon layer 18 where they are adjacent.

Figure 5:
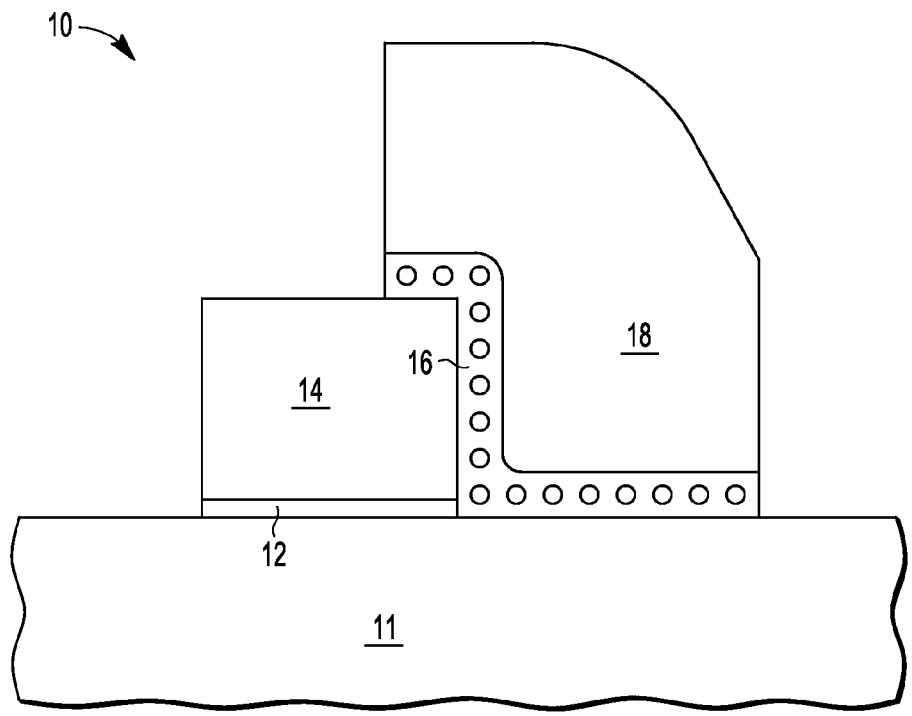
FIG. 5 is a cross section of the semiconductor device of FIG. 4 at a subsequent stage in processing.

Shown in FIG. 5 is semiconductor device 10 after etching polysilicon layer 14 and amorphous layer 18 to leave select gate portion 14 of FIGS. 1-4 as a select gate. As shown in FIG. 5, select gate portion 14 has had a portion removed on the side away from amorphous silicon layer 18. Similarly, amorphous layer has had a portion removed on the side away from select gate portion 14. This results in exposing portions of substrate 11 on each side of the remaining portions of polysilicon layer 14 and amorphous silicon layer 18.

Figure 6:
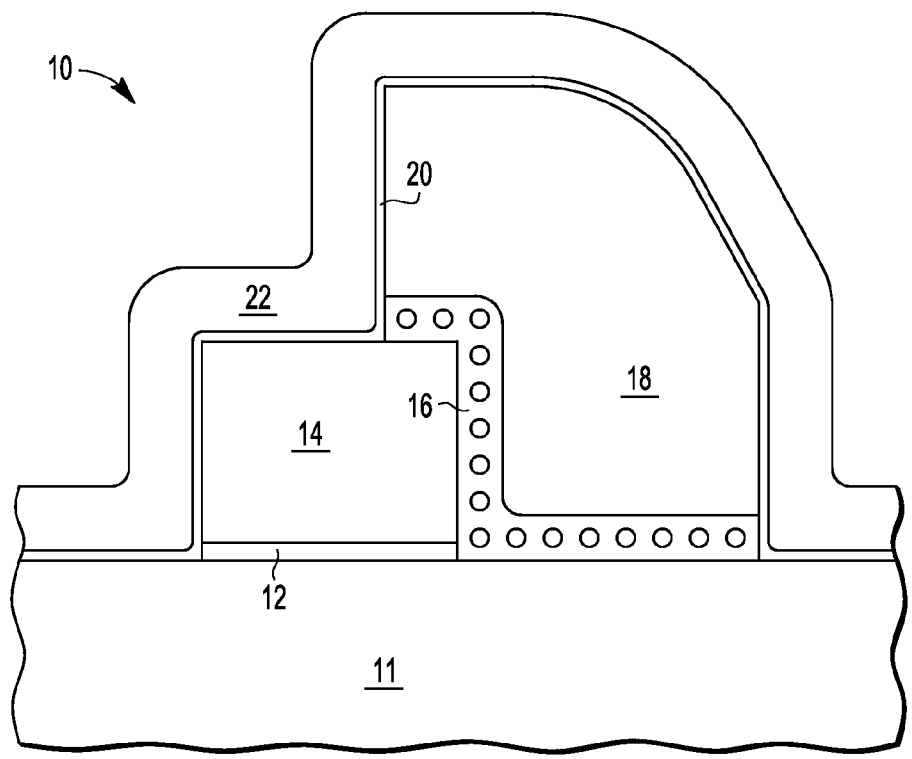
FIG. 6 is a cross section of the semiconductor device of FIG. 5 at a subsequent stage in processing.

Shown in FIG. 6 is semiconductor device 10 after forming an oxide liner 20 over semiconductor device 10 including the exposed portions of substrate 11 and exposed portions of polysilicon layer 14 and amorphous silicon layer 18. The exposed portions of substrate 11 are where source/drains are to be formed. Also shown is semiconductor device 10 after forming a stressor layer 22 over liner 20 and thus also over semiconductor device 10 including polysilicon layer 14, amorphous silicon layer, and the substrate where source/drains are to be formed. Oxide liner 20 needs to be deposited at a sufficiently low temperature to avoid prematurely converting amorphous silicon layer 18 to polysilicon. For example, oxide liner may be deposited by a temperature known as low temperature oxide (LTO). Stressor layer 22 should also be deposited at a sufficiently low temperature to avoid prematurely converting amorphous silicon layer 18 to polysilicon. Stressor layer 22 may be nitride deposited by plasma-enhanced chemical vapor deposition (PECVD).

Figure 7:
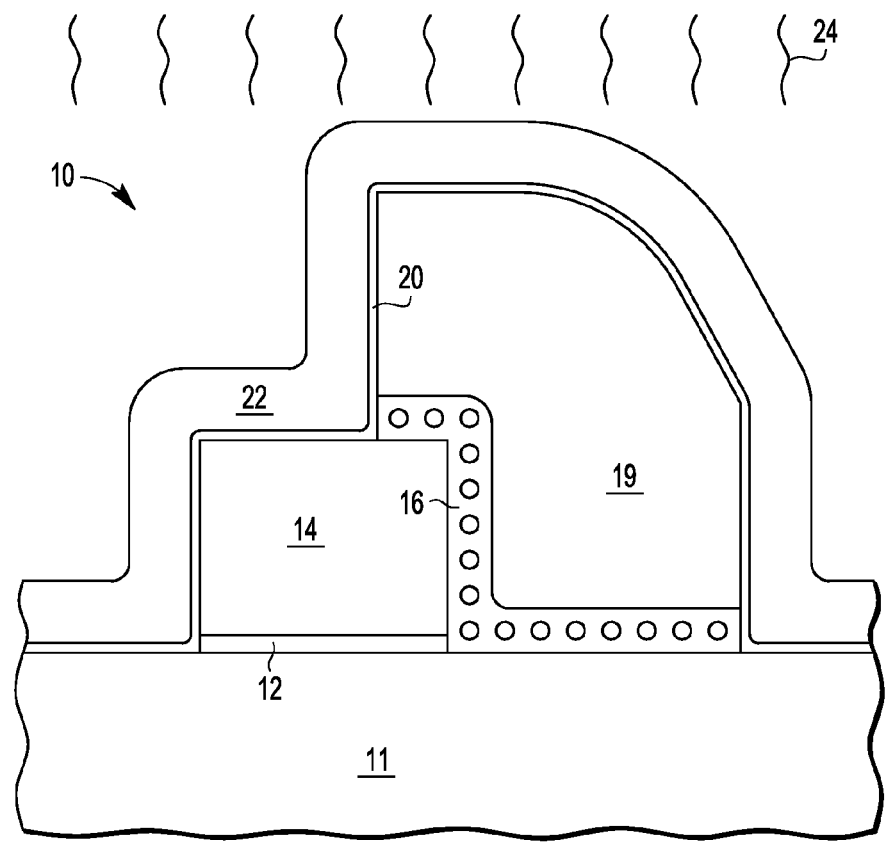
FIG. 7 is a cross section of the semiconductor device of FIG. 6 at a subsequent stage in processing.

Shown in FIG. 7 is semiconductor device 10 after performing an anneal 24 which is at a sufficiently high temperature to convert amorphous silicon layer 18 to a polysilicon control gate 19. The conversion of amorphous to polysilicon, if unconstrained, will result in an increase in volume. Thus the anneal has the effect of causing an outward pressure being applied to stressor layer 22. Although the mechanism is not certain, the result is a compressive stress in polysilicon control gate 19, a tensile stress in the plane of charge storage layer 16 in the area under polysilicon control gate 19, and a tensile stress in substrate 11 in the area under polysilicon layer 14 and polysilicon control gate 19, which is where the channel of the completed NVM cell will be. Adding impurities to amorphous silicon layer 18 can be useful increasing the added stress. The anneal is preferably a rapid thermal anneal (RTA) and may be at a temperature in a range of from 500 to 1100 degrees Celsius.

Figure 8:
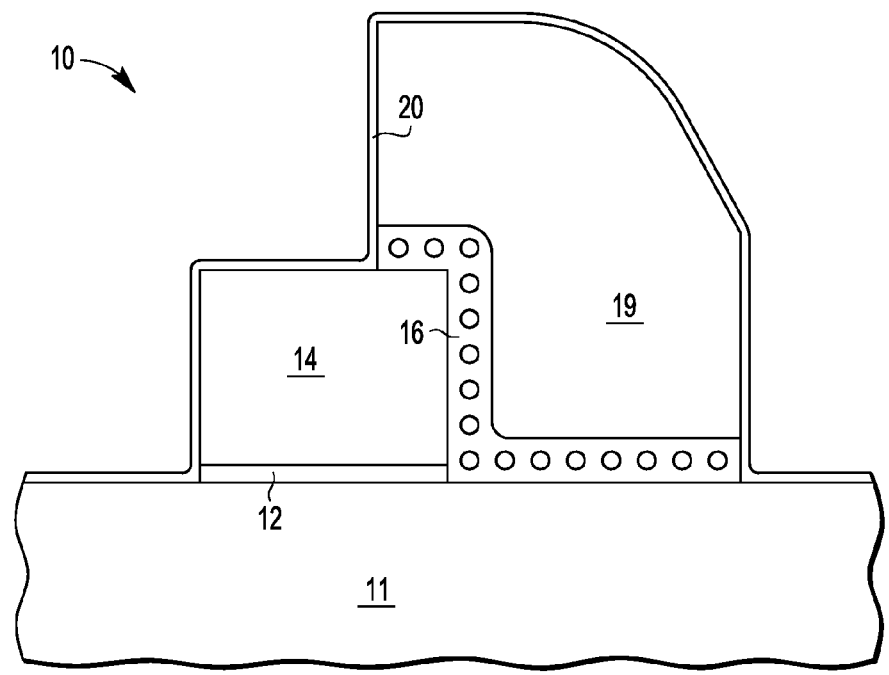
FIG. 8 is a cross section of the semiconductor device of FIG. 7 at a subsequent stage in processing.

Shown in FIG. 8 is semiconductor device 10 after removing stressor 22. Although the mechanism is not well understood, the stress generated by this process is effective and retained even after stressor layer 22 is removed. Stressor 22 may be nitride which makes it relatively easy to remove selective to oxide layer 20. Stressor 22 preferably applies a tensile stress as deposited, but there may be situations in which there are reasons to apply a stressor with minimal or no stress but yet still achieve some benefit because of the amorphous to polysilicon conversion. The presence of stressor 22 helps the transfer of stress to the substrate by constraining the expansion of amorphous layer 18 to polysilicon control gate 19, but some beneficial stress may be transferred in the amorphous to polysilicon transfer even in the absence of a stressor layer.

Figure 9:
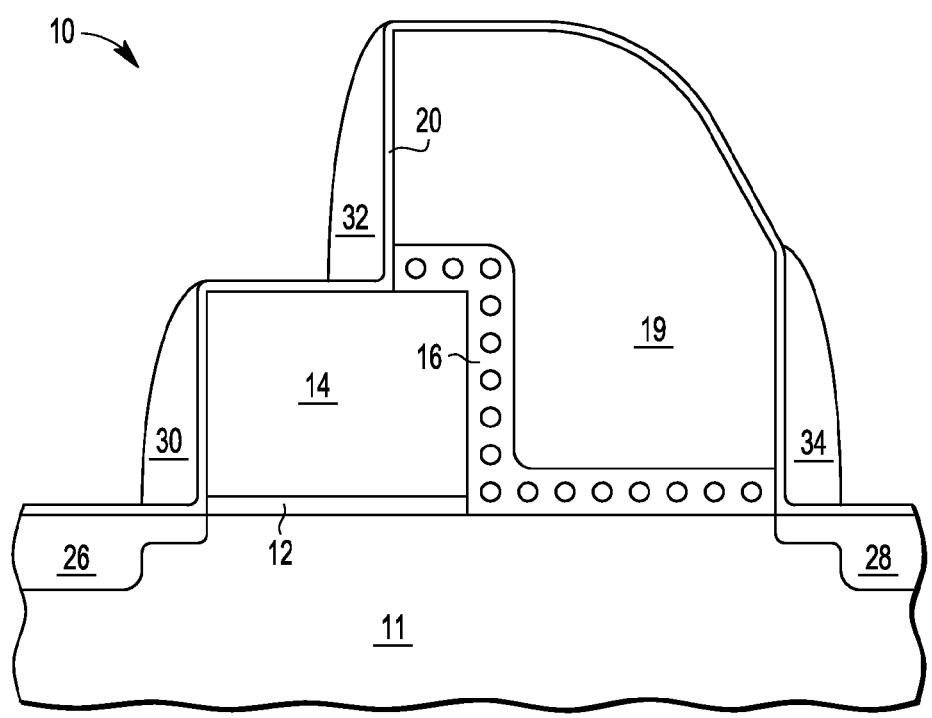
FIG. 9 is a cross section of the semiconductor device of FIG. 8 at a subsequent stage in processing as a non-volatile memory cell.

Shown in FIG. 9 is semiconductor device 10 with source/drain regions 26 and 28 on opposing sides of the channel region in substrate 11 under the select gate, which is polysilicon layer 14 of FIG. 9, and polysilicon control gate 19. Sidewall spacers 30, 32 and 34 are also shown. Sidewall spacers 30 and 34 are useful in forming the heavily doped portions of source/drain regions 26 and 28. Semiconductor device 10 of FIG. 9 is a split gate NVM memory cell. Thus it is seen that an NVM cell, having a split gate, is able to achieve increased tensile stress and thus improve performance using the method described above.

By now it should be apparent that a method of making a semiconductor device on a semiconductor layer has been described. The method includes forming a gate dielectric over the semiconductor layer. The method further includes forming a layer of gate material over the gate dielectric. The method further includes etching the layer of gate material to form a select gate. The method further includes forming a storage layer that extends over the select gate and over a portion of the semiconductor layer. The method further includes depositing an amorphous silicon layer over the storage layer. The method further includes etching the amorphous silicon layer to form a control gate. The method further includes annealing the semiconductor device to crystallize the amorphous silicon layer. The method may further comprise forming a capping layer over the semiconductor device, the capping layer formed prior to the step of annealing the semiconductor device. The method may further comprise removing the capping layer from over the semiconductor device after the step of annealing the semiconductor device. The method may further be characterized by forming the capping layer further comprising forming a capping layer that causes a channel region in the semiconductor layer to be laterally tensile stressed. The method may further be characterized by forming the capping layer further comprising forming the capping layer from tensile stressed silicon nitride. The method may further be characterized by the step of depositing a silicon layer comprising sputtering silicon and an impurity, wherein the impurity comprises one of group consisting of nickel, gold, aluminum, silver, and palladium. The method may further be characterized by annealing the semiconductor device to crystallize the amorphous silicon layer further comprising annealing the semiconductor device at a temperature in a range of 500 to 1100 degrees Celsius. The method may further be characterized by depositing the amorphous silicon layer over the storage layer further comprising depositing the amorphous silicon layer to have a thickness in a range of 50 to 250 nanometers. The method may further be characterized by etching the amorphous silicon layer to form the control gate further comprising etching the amorphous silicon layer to form the control gate having a portion formed over a portion of the select gate. The method may further be characterized by forming the storage layer being further characterized by the storage layer comprising nanocrystals. The method may further be characterized by the step of depositing the amorphous silicon layer being performed by sputtering.

Also described is a method of making a semiconductor device on a semiconductor layer. The method includes forming a gate dielectric over the semiconductor layer. The method further includes forming a layer of gate material over the gate dielectric. The method further includes etching the layer of gate material to form a select gate. The method further includes forming a charge storage layer that extends over the select gate and over a portion of the semiconductor layer. The method further includes depositing an amorphous silicon layer over the charge storage layer. The method further includes etching the amorphous silicon layer to form a control gate. The method further includes forming a liner on the semiconductor device. The method further includes forming a capping layer over the liner. The method further includes annealing the semiconductor device to crystallize the amorphous silicon layer. The method may further comprise removing the capping layer from over the semiconductor device after the step of annealing the semiconductor device. The method may be further characterized by forming the capping layer further comprising forming the capping layer from tensile stressed silicon nitride. The method may be further characterized by forming the capping layer further comprising depositing a silicon nitride layer having a thickness in a range of 20 to 200 nanometers. The method may be further characterized by annealing the semiconductor device to crystallize the amorphous silicon layer further comprising annealing the semiconductor device at a temperature in a range of 500 to 1100 degrees Celsius. The method may be further characterized by depositing the amorphous silicon layer over the storage layer being further characterized by sputtering silicon and an impurity. The method may be further characterized by forming the charge storage layer being further characterized by the charge storage layer comprising nanocrystals.

Described also is a method of making a semiconductor device on a semiconductor layer. The method includes forming a gate dielectric over the semiconductor layer. The method further includes forming a polysilicon layer over the gate dielectric. The method further includes etching the polysilicon layer to form a select gate. The method further includes forming a charge storage layer that extends over the select gate and over a portion of the semiconductor layer, wherein the charge storage layer comprises nanocrystals. The method further includes depositing an amorphous silicon layer over the charge storage layer. The method further includes etching the amorphous silicon layer to form a control gate, the control gate having a portion formed over a portion of the select gate. The method further includes forming an insulating liner on the semiconductor device. The method further includes forming a tensile stressed silicon nitride layer over the insulating liner. The method further includes annealing the semiconductor device to crystallize the amorphous silicon layer. The method further includes removing the tensile stressed silicon nitride layer. The method may be further characterized by forming the silicon nitride layer further comprising depositing a silicon nitride layer having a thickness in a range of 20 to 200 nanometers, annealing the semiconductor device to crystallize the amorphous silicon layer further comprising annealing the semiconductor device at a temperature in a range of 500 to 1100 degrees Celsius, and depositing the amorphous silicon layer over the charge storage layer being by sputtering.

Although the invention is described herein with reference to specific embodiments, various modifications and changes can be made without departing from the scope of the present invention as set forth in the claims below. For example, different processes may be used for obtaining some of the temporary structures obtained in order to make effective use of the conversion from amorphous silicon to polysilicon. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor device on a semiconductor layer, comprising:
   forming a gate dielectric over the semiconductor layer;
   forming a layer of gate material over the gate dielectric;
   etching the layer of gate material to form a select gate;
   forming a storage layer that extends over the select gate and over a portion of the semiconductor layer;
   depositing an amorphous silicon layer over the storage layer;
   etching the amorphous silicon layer to form a control gate; and
   annealing the semiconductor device to crystallize the amorphous silicon layer, wherein the step of depositing the amorphous silicon layer comprises sputtering silicon and an impurity, wherein the impurity comprises one of group consisting of nickel, gold, aluminum, silver, and palladium.

2. A method of making a semiconductor device on a semiconductor layer, comprising:
   forming a gate dielectric over the semiconductor layer;
   forming a layer of gate material over the gate dielectric;
   etching the layer of gate material to form a select gate;
   forming a storage layer that extends over the select gate and over a portion of the semiconductor layer;
   depositing an amorphous silicon layer over the storage layer;
   etching the amorphous silicon layer to form a control gate;
   annealing the semiconductor device to crystallize the amorphous silicon layer; and
   forming a capping layer over the semiconductor device, the capping layer formed prior to the step of annealing the semiconductor device.

3. The method of claim 2, further comprising removing the capping layer from over the semiconductor device after the step of annealing the semiconductor device.

4. The method of claim 2, wherein forming the capping layer further comprises forming a capping layer that causes a channel region in the semiconductor layer to be laterally tensile stressed.

5. The method of claim 2, wherein forming the capping layer further comprises forming the capping layer from tensile stressed silicon nitride.

6. The method of claim 1, wherein annealing the semiconductor device to crystallize the amorphous silicon layer further comprises annealing the semiconductor device at a temperature in a range of 500 to 1100 degrees Celsius.

7. The method of claim 1, wherein depositing the amorphous silicon layer over the storage layer further comprises depositing the amorphous silicon layer to have a thickness in a range of 50 to 250 nanometers.

8. The method of claim 1, wherein etching the amorphous silicon layer to form the control gate further comprises etching the amorphous silicon layer to form the control gate having a portion formed over a portion of the select gate.

9. A method of making a semiconductor device on a semiconductor layer, comprising:
   forming a gate dielectric over the semiconductor layer;
   forming a layer of gate material over the gate dielectric;
   etching the layer of gate material to form a select gate;
   forming a storage layer that extends over the select gate and over a portion of the semiconductor layer;
   depositing an amorphous silicon layer over the storage layer;
   etching the amorphous silicon layer to form a control gate; and
   annealing the semiconductor device to crystallize the amorphous silicon layer,
   wherein forming the storage layer is further characterized by the storage layer comprising nanocrystals.

10. A method of making a semiconductor device on a semiconductor layer, comprising:
    forming a gate dielectric over the semiconductor layer;
    forming a layer of gate material over the gate dielectric;
    etching the layer of gate material to form a select gate;
    forming a storage layer that extends over the select gate and over a portion of the semiconductor layer;
    depositing an amorphous silicon layer over the storage layer;
    etching the amorphous silicon layer to form a control gate; and
    annealing the semiconductor device to crystallize the amorphous silicon layer,
    wherein the step of depositing the amorphous silicon layer is performed by sputtering.

11. A method of making a semiconductor device on a semiconductor layer, comprising:
    forming a gate dielectric over the semiconductor layer;
    forming a layer of gate material over the gate dielectric;
    etching the layer of gate material to form a select gate;
    forming a charge storage layer that extends over the select gate and over a portion of the semiconductor layer;
    depositing an amorphous silicon layer over the charge storage layer;
    etching the amorphous silicon layer to form a control gate;
    forming a liner on the semiconductor device;
    forming a capping layer over the liner; and
    annealing the semiconductor device to crystallize the amorphous silicon layer.

12. The method of claim 11, further comprising removing the capping layer from over the semiconductor device after the step of annealing the semiconductor device.

13. The method of claim 11 wherein forming the capping layer further comprises forming the capping layer from tensile stressed silicon nitride.

14. The method of claim 11, wherein forming the capping layer further comprises depositing a silicon nitride layer having a thickness in a range of 20 to 200 nanometers.

15. The method of claim 11, wherein annealing the semiconductor device to crystallize the amorphous silicon layer further comprises annealing the semiconductor device at a temperature in a range of 500 to 1100 degrees Celsius.

16. The method of claim 11, wherein depositing the amorphous silicon layer over the charge storage layer is further characterized by sputtering silicon and an impurity.

17. The method of claim 11, wherein forming the charge storage layer is further characterized by the charge storage layer comprising nanocrystals.

18. A method of making a semiconductor device on a semiconductor layer, comprising:
    forming a gate dielectric over the semiconductor layer;
    forming a polysilicon layer over the gate dielectric;
    etching the polysilicon layer to form a select gate;
    forming a charge storage layer that extends over the select gate and over a portion of the semiconductor layer, wherein the charge storage layer comprises nanocrystals;
    depositing an amorphous silicon layer over the charge storage layer;
    etching the amorphous silicon layer to form a control gate, the control gate having a portion formed over a portion of the select gate;
    forming an insulating liner on the semiconductor device;
    forming a tensile stressed silicon nitride layer over the insulating liner;
    annealing the semiconductor device to crystallize the amorphous silicon layer; and
    removing the tensile stressed silicon nitride layer.

19. The method of claim 18, wherein:
    forming the tensile stressed silicon nitride layer further comprises depositing a silicon nitride layer having a thickness in a range of 20 to 200 nanometers;
    annealing the semiconductor device to crystallize the amorphous silicon layer further comprises annealing the semiconductor device at a temperature in a range of 500 to 1100 degrees Celsius; and
    depositing the amorphous silicon layer over the charge storage layer is by sputtering.

* * * * *